United States Patent
Maeda

(10) Patent No.: US 6,797,910 B2
(45) Date of Patent: Sep. 28, 2004

(54) PRODUCTION APPARATUS OF PLANER TYPE SEMICONDUCTOR DEVICE AND FABRICATION METHOD OF PLANER TYPE SEMICONDUCTOR DEVICE

(75) Inventor: Hiroshi Maeda, Matsubara (JP)

(73) Assignee: Sharp Kabushiki Kaisha, Osaka (JP)

( * ) Notice: Subject to any disclaimer, the term of this patent is extended or adjusted under 35 U.S.C. 154(b) by 49 days.

(21) Appl. No.: 10/207,817

(22) Filed: Jul. 31, 2002

(65) Prior Publication Data

US 2003/0038368 A1 Feb. 27, 2003

(30) Foreign Application Priority Data

Jul. 31, 2001 (JP) ........................................ 2001-231543

(51) Int. Cl.$^7$ ............................................... B23K 11/00
(52) U.S. Cl. ..................................................... 219/56.22
(58) Field of Search .......................... 219/56.1, 56.21, 219/56.22, 110

(56) References Cited

U.S. PATENT DOCUMENTS

| | | | | |
|---|---|---|---|---|
| 3,238,351 A | * | 3/1966 | Hill .......................... | 219/56.1 |
| 3,284,606 A | * | 11/1966 | Schroeppel ............... | 219/56.21 |
| 3,459,918 A | * | 8/1969 | Rzant ....................... | 219/56.21 |
| 4,876,430 A | * | 10/1989 | Herschitz et al. ........... | 219/110 |
| 5,138,127 A | * | 8/1992 | Fries et al. ............... | 219/56.21 |
| 5,360,958 A | * | 11/1994 | Bogue et al. ............. | 219/56.21 |

FOREIGN PATENT DOCUMENTS

| | | |
|---|---|---|
| JP | 2-284440 | 11/1990 |
| JP | 3-198984 | 8/1991 |
| JP | 9-323173 | 12/1997 |

* cited by examiner

Primary Examiner—Clifford C. Shaw
(74) Attorney, Agent, or Firm—Nixon & Vanderhye P.C.

(57) ABSTRACT

In a planer type semiconductor device production apparatus having an interconnector to lead out an output of a planer type semiconductor element electrically connected with an external output electrode of the planer type semiconductor element through parallel gap welding, a weld bed on which is mounted a planer type semiconductor element to be welded is formed of a material with stainless steel as the main component. As a result, a planer type semiconductor device production apparatus that can conduct favorable welding, and a method of fabricating a planer type semiconductor device using such a production apparatus are obtained.

6 Claims, 9 Drawing Sheets

PRODUCTION APPARATUS OF PLANER TYPE SEMICONDUCTOR DEVICE AND FABRICATION METHOD OF PLANER TYPE SEMICONDUCTOR DEVICE

BACKGROUND OF THE INVENTION

1. Field of the Invention

The present invention relates to a production apparatus of a planer type semiconductor device welding an interconnector to a planer type semiconductor element, and a method of fabricating a planer type semiconductor device.

2. Description of the Background Art

An example of a production apparatus of a planer type semiconductor device having an interconnector to lead out an output of a conventional planer type semiconductor element connected by parallel gap welding, and a method of fabricating a planer type semiconductor device will be described with reference to FIGS. 12 and 13. A planer type semiconductor element 105 is placed and fixed on a weld bed 106. An interconnector 103 is disposed on an electrode 104 of planer type semiconductor element 105. Weld electrodes 101 and 102 are abutted against interconnector 103. Load is applied on weld electrodes 101 and 102, and a current is conducted across weld electrodes 101 and 102. Welding is effected by the resistance heat generated here. Welding is repeatedly conducted by moving weld electrodes 101 and 102 corresponding to the width of interconnector 103.

In the above-described conventional production apparatus, aluminum is generally used for the material of weld bed 106 on which planer type semiconductor element 105 is placed. Aluminum is used by virtue of its workability and low cost. It is to be noted that aluminum has an extremely high thermal conductivity. When aluminum is used for weld bed 106, the heat generated for welding will escape through weld bed 106. There was a problem that sufficient welding cannot be achieved, resulting in degradation of the weld strength.

According to a welding method using the conventional production apparatus of a planer type semiconductor device, welding is repeatedly conducted when there are a plurality of welding positions P for one interconnector 103. Therefore, the temperature of weld electrodes 101 and 102 and weld bed 106 of interconnector 103 sequentially rises from the first site of welding to the second site, third site, and on, and is not stable. Also, the escaping manner of heat during welding differs depending upon weld position P. By this difference in temperature, sufficient welding may not be achieved at some parts. There is a problem that weld strength is degraded. Likewise, in the case where the welding operation is carried out continuously for two times or more, the temperature of weld electrodes 101 and 102 and weld bed 106 will sequentially rise from the first welding operation, and is not stable.

In a welding method using a conventional production apparatus of a planer type semiconductor device, a current is conducted across weld electrodes 101 and 102 to generate resistance heat for welding. At this stage, weld electrodes 101 and 102 glow and attain a high temperature to react with oxygen in the air. As a result, weld electrodes 101 and 102 will be oxidized. Nitrogen gas is blown out through a nozzle to weld electrodes 101 and 102 to minimize such oxidation (refer to FIG. 12). However, oxidation cannot be prevented sufficiently by just this blowing measure. As oxidation proceeds, the resistance of weld electrodes 101 and 102 becomes higher to shorten the lifetime. Increasing this lifetime is one issue from the standpoint of cost.

SUMMARY OF THE INVENTION

An object of the present invention is to provide a planer type semiconductor device production apparatus that can effect favorable welding, and a method of fabricating a planer type semiconductor device using such a production apparatus.

According to the present invention, a planer type semiconductor device production apparatus electrically connects an interconnector to lead out an output of a planer type semiconductor element with an external output electrode of the planer type semiconductor element through parallel gap welding. A weld bed on which is placed the planer type semiconductor element that is to be welded is formed of a material with stainless steel as the main component.

By employing a weld bed with stainless steel as the main component in the planer type semiconductor device production apparatus of the present aspect, the thermal conductivity becomes lower than the thermal conductivity of the generally used aluminum weld bed. Therefore, the heat generated for welding will not escape through the bed. Thus, favorable welding can be conducted.

According to a planer type semiconductor device production apparatus of another aspect of the present invention that electrically connects an interconnector to lead out an output of a planer type semiconductor element with an external output electrode of the planer type semiconductor element through parallel gap welding, a weld bed on which is placed a planer semiconductor element to be welded is formed of a material with ceramics as the main component.

By using a weld bed with ceramics as the main component in the planer type semiconductor device production apparatus of the present aspect, the thermal conductivity becomes lower than the thermal conductivity of the generally used aluminum weld bed. Therefore, the heat generated for welding will not escape through the bed. Thus favorable welding can be conducted. Furthermore, the apparatus of the present aspect with a weld bed formed mainly of ceramics is higher in performance than the apparatus with a weld bed formed mainly of stainless steel since ceramics has a lower thermal conductivity than stainless steel.

According to a planer type semiconductor device production apparatus of a further aspect of the present invention that electrically connects an interconnector to lead out an output of a planer type semiconductor element with an external output electrode of the planer type semiconductor element through parallel gap welding, a weld bed temperature control mechanism is provided to control the temperature of the weld bed on which is placed a planer type semiconductor element to be welded.

By having the weld bed hold heat in advance through the control of the temperature of the weld bed by the planer type semiconductor device production apparatus of the present aspect, the heat generated for welding will not be depleted by the bed. Thus, favorable welding can be conducted.

Preferably in the planer type semiconductor device production apparatus of the present invention, the area of the plane of the weld bed where the planer type semiconductor element to be welded is placed is set to be not more than the area of the planer type semiconductor element in contact with the plane of the weld bed.

By such a planer type semiconductor device production apparatus, the heat quantity depleted by the weld bed among the heat generated for welding is reduced. Thus, favorable welding can be conducted.

In the planer type semiconductor device production apparatus of the present invention, the thickness of the weld bed may be not more than 3 mm.

By using a weld plate set as thin as possible in structure in such a planer type semiconductor device production apparatus, the heat capacity can be reduced to the best possible degree. Therefore, the heat quantity depleted by the weld bed among the heat generated for welding is reduced. Thus, favorable welding can be conducted.

According to still another aspect of the present invention, a planer type semiconductor device fabrication method electrically connect an interconnector to lead out an output of a planer type semiconductor element with an external output electrode of the planer type semiconductor element through parallel gap welding. When there are at least two welding positions in one interconnector in the welding process through parallel gap welding, the power for welding is set for each welding position.

Accordingly, the power at the position where the welding strength was low can be increased whereas the power at the welding position where excessive power was applied can be reduced. Thus, favorable welding can be conducted.

In a planer type semiconductor device fabrication method electrically connecting an interconnector to lead an output of a planer type semiconductor element with an external output electrode of the planer type semiconductor element through parallel gap welding of a still further aspect of the present invention, the power for welding can be set in advance for each welding operation when the welding operation is carried out at least two times successively in the welding process through the parallel gap welding.

The power for welding can be set relatively high since the temperature of the welding electrodes and the weld bed is low at the first welding operation. The power for welding can be set lower thereof for the second operation. Appropriate setting is allowed for the third welding operations and et seq. so that stable welding temperature can be achieved. Thus, favorable welding can be conducted.

In a planer type semiconductor device fabrication method electrically connecting an interconnector to lead out an output of a planer type semiconductor element with an external output electrode of the planer type semiconductor element according to yet a further aspect of the present invention, welding is conducted with the surrounding of at least a weld electrode set in a gas atmosphere that suppresses oxidation of the weld electrode in the weld process through parallel gap welding.

By setting the surrounding of the weld electrode in a gas atmosphere in the planer type semiconductor device fabrication method, the glow and oxidation of the weld electrode during welding can be suppressed. Thus, the lifetime of the weld electrode can be increased.

In a planer type semiconductor device fabrication method that electrically connects an interconnector to lead out an output of a planer type semiconductor element with an external output electrode of a planer type semiconductor element through parallel gap welding according to yet another aspect of the present invention, welding is conducted with the surrounding of at least a weld electrode in vacuum in the welding process through parallel gap welding.

Accordingly, the glow and oxidation of the weld electrode during welding can be suppressed. Thus, the lifetime of the weld electrode can be increased.

In a planer type semiconductor device fabrication method that electrically connects an interconnector to lead out an output of a planer type semiconductor element with an external output electrode of the planer type semiconductor element through parallel gap welding according to yet a still further aspect of the present invention, a weld bed on which is placed a planer type semiconductor element to be welded is formed of a material with stainless or ceramics as the main component. The temperature of the weld bed with stainless steel or ceramics as the main component is controlled using a weld bed temperature control mechanism. Also, the power for welding is set for at least either each welding operation or each welding position.

According to the planer type semiconductor device fabrication method, the temperature of the weld bed is controlled so that the heat generated for welding will not be depleted through the weld bed. Also, welding can be conducted with an appropriate power for welding corresponding to at least either the welding position or welding operation.

In the planer type semiconductor device production apparatus or planer type semiconductor device fabrication method of the present invention, weld electrodes may be formed of an electrode with tungsten (W) as the main component and an electrode with copper (Cu) as the main component.

By using an electrode with tungsten as the main component and an electrode with copper as the main component for parallel gap welding, the effect of conducting favorable welding can be exhibited more significantly.

In a planer type semiconductor device fabrication method or planer type semiconductor device fabrication method of the present invention, the interconnector may have a comb shape with a slit. Accordingly, the effect of conducting favorable welding can further be exhibited more significantly.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
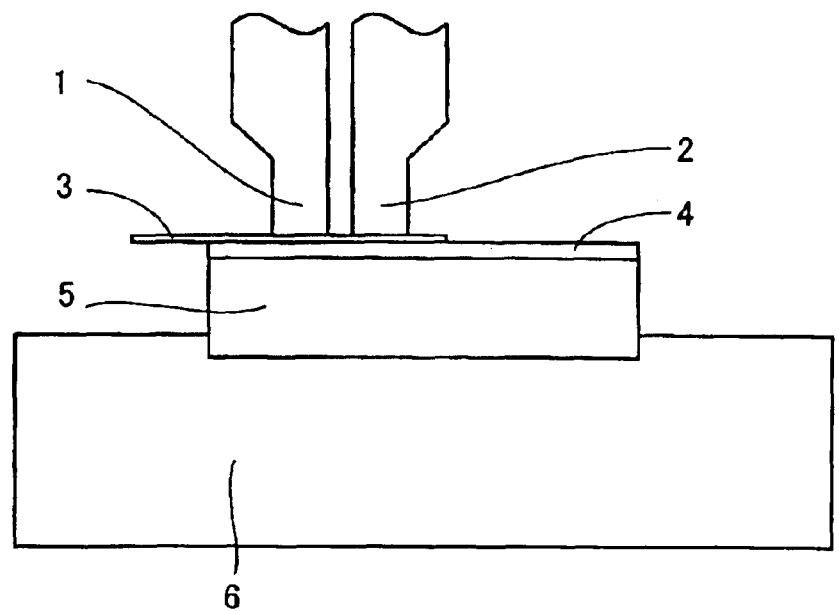
FIGS. 1 and 2 are schematic sectional views of a planer type semiconductor device production apparatus of the first embodiment.
Figure 2:
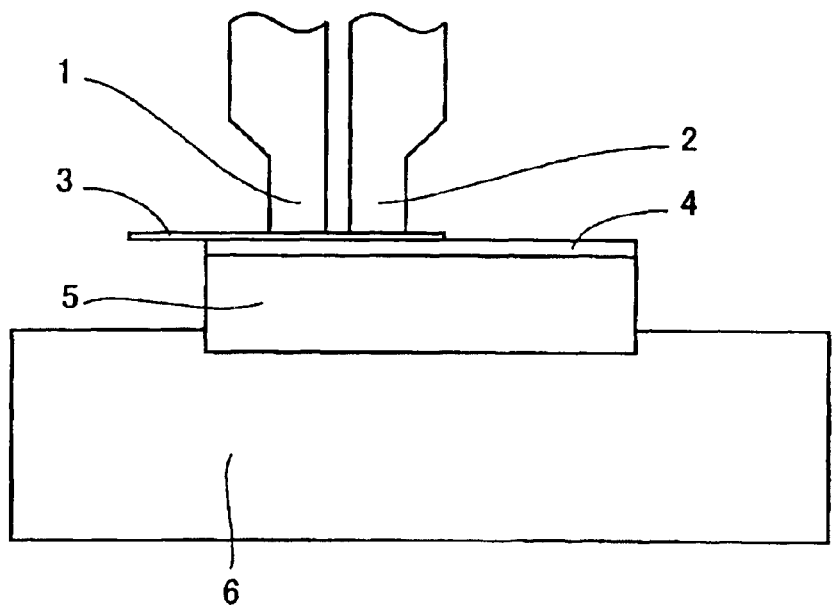

A planer type semiconductor device production apparatus and a method of fabricating a planer type semiconductor device using such a production apparatus according to the first embodiment of the present invention will be described with reference to FIGS. 1 and 2. In the planer type semiconductor device production apparatus of the present embodiment, a planer type semiconductor element 5 is placed and fixed on a weld bed 6 made of stainless steel or ceramics. An interconnector 3 to lead out an output is placed on an electrode 4 of planer type semiconductor element 5. Weld electrodes 1 and 2 of weld equipment employed in parallel gap welding are abutted against interconnector 3. Load is applied on weld electrodes 1 and 2, and a current is conducted across weld electrodes 1 and 2. Welding is conducted using resistance heat generated here.

According to the planer type semiconductor device production apparatus and fabrication method using such a production apparatus of the present embodiment, the usage of a weld bed 6 formed of stainless steel or ceramics suppresses the heat generated for welding from being depleted through weld bed 6 since the thermal conductivity of a stainless steel weld bed 6 and a ceramics weld bed 6 is lower by one order of magnitude and by two order of magnitude, respectively, as compared to the thermal conductivity of an aluminum bed, as shown in Table 1. Thus, interconnector 3 can be welded favorably to planer type semiconductor element 5.

TABLE 1

Physical Properties of Respective Materials

|  | Aluminum | Stainless Steel | Ceramics |  |
|---|---|---|---|---|
| Thermal Conductivity | 240 | 17 | 1.5 | $(W \cdot m^{-1} \cdot K^{-1})$ |
| Specific Heat | 0.9 | 0.5 | 1.1 | $(J \cdot g^{-1} \cdot K^{-1})$ |
| Density | 2.7 | 7.9 | 2.3 | $(g \cdot cm^{-3})$ |
| Heat Capacity | 2.5 | 4.1 | 2.5 | $(J \cdot K^{-1} \cdot cm^{-3})$ |

It is appreciated from Table 1 that the thermal conductivity becomes lower in the order of aluminum, stainless steel and ceramics, so that the heat for welding is less depleted through the bed in this order.

Although the processing cost for a stainless steel or ceramics welding bed may be slightly disadvantageous to an aluminum bed in the aspect of processing cost, the product yield will be increased significantly, exhibiting high reliability. Thus, it is substantially more profitable.

Second Embodiment

Figure 3:
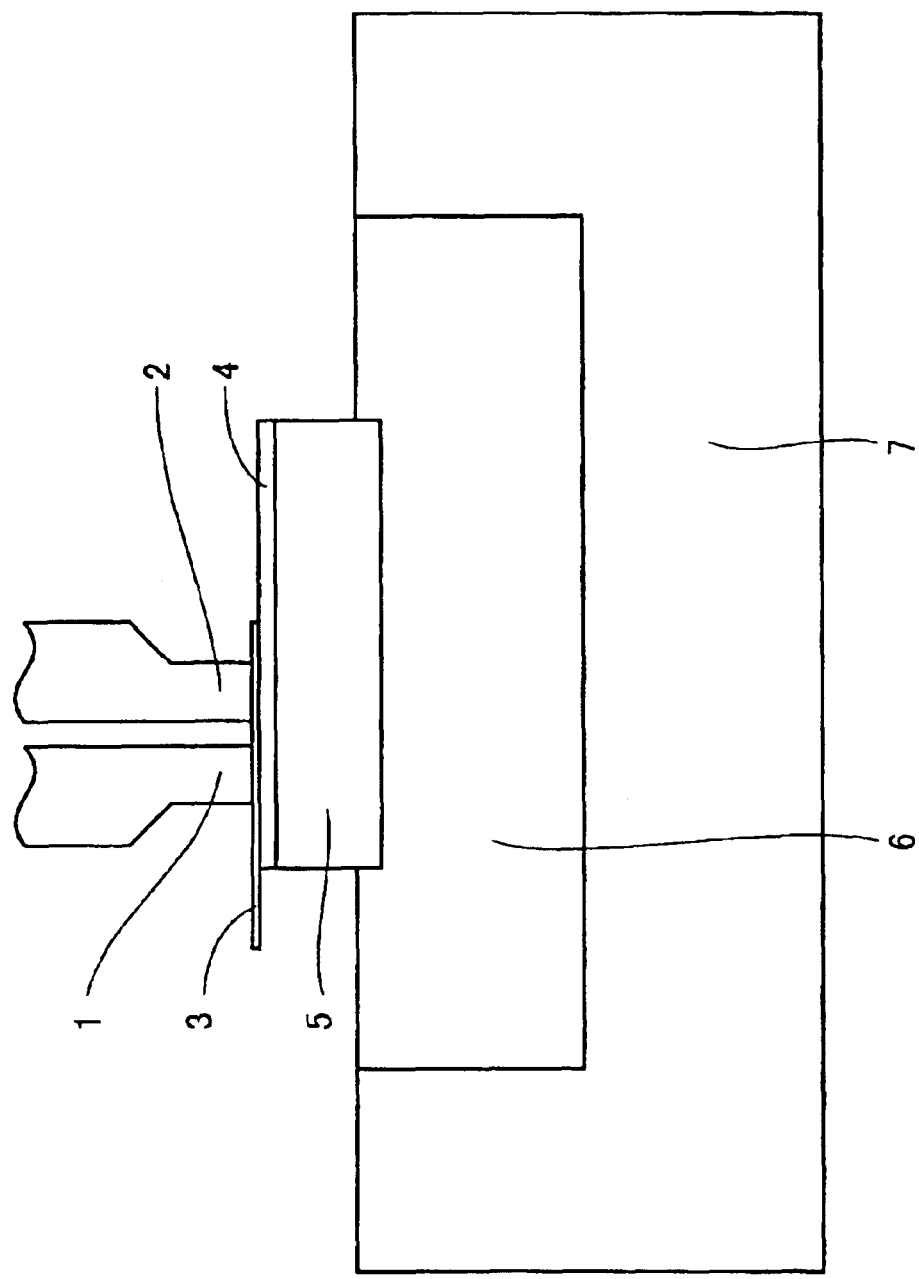
FIG. 3 is a schematic sectional view of a planer type semiconductor device production apparatus according to a second embodiment.

A planer type semiconductor device production apparatus and a method of fabricating a planer type semiconductor device using such a production apparatus according to a second embodiment will be described with reference to FIG. 3. According to the planer type semiconductor device production apparatus and fabrication method using such a production apparatus of the present embodiment, a planer type semiconductor element 5 is placed and fixed on a weld bed 6 with a temperature control device 7 having temperature control capability. An interconnector 3 to provide an output is placed on an electrode 4 of planer type semiconductor element 5. Weld electrodes 1 and 2 of weld equipment employed in parallel gap welding are abutted against interconnector 3. Load is applied on weld electrodes 1 and 2, and a current is conducted across weld electrodes 1 and 2. Welding is conducted using the resistance heat generated. By using a weld bed 6 with a temperature control device 7 in the present embodiment, weld bed 6 is made to hold heat in advance. Therefore, little, if any, heat generated for welding will be depleted by weld bed 6. Thus, favorable welding can be conducted.

The temperature of weld bed 6 is set to a level that does not adversely affect the characteristics of planer type semiconductor element 5. For example, the temperature of weld bed 6 is set to 300° C. A temperature higher thereof will cause electrode 4 of planer type semiconductor element 5 to dig into planer type semiconductor element 5, whereby the device characteristics will be adversely affected. Also, weld electrodes 1 and 2 per se will be oxidized.

It is assumed that weld electrodes 1 and 2, when carried manually, must be handled with care in the case where the temperature of weld bed 6 is raised. The usage of tweezers or the like can eliminate this problem. In the case of an automatic carrier, this problem is generally of no concerned by using a heat-resistant arm. By employing the planer type semiconductor device production apparatus and fabrication method using such a production apparatus of the present embodiment, the cost may be slightly increased. However, the product yield will be increased significantly, exhibiting high reliability. Thus, it is substantially more profitable.

Third Embodiment

Figure 4:
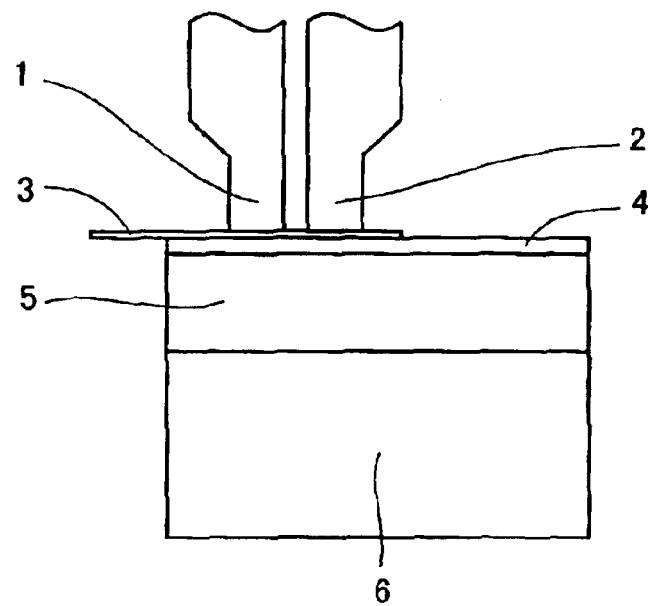
FIG. 4 is a schematic sectional view of a planer type semiconductor device production apparatus according to a third embodiment.
Figure 5:
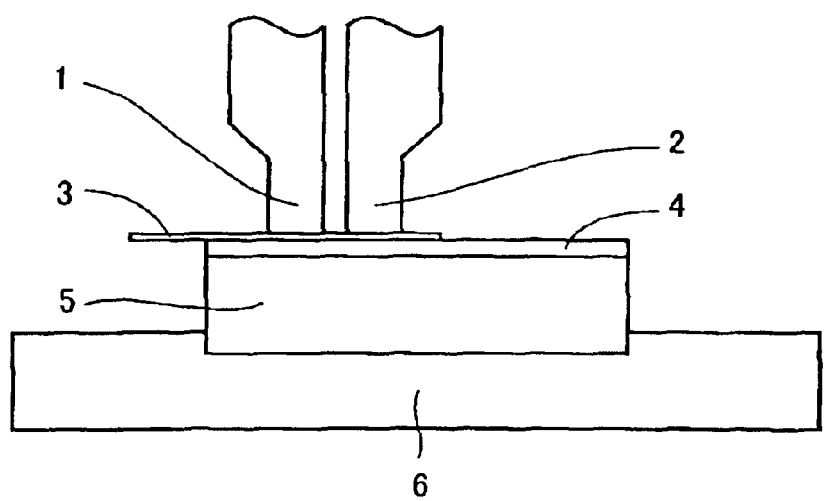
FIG. 5 is a schematic sectional view of a planer type semiconductor device production apparatus of another example in the third embodiment.

A planer type semiconductor device production apparatus and a fabrication method of a planer type semiconductor device using such a production apparatus of a third embodiment will be described with reference to FIGS. 4 and 5. As shown in FIG. 4, the area of weld bed 6 of the planer type semiconductor device production apparatus of the present embodiment in contact with the mounting plane of planer type semiconductor element 5 is equal to the size of planer type semiconductor element 5 or not larger than the contacting area of planer type semiconductor element 5. Also, as shown in FIG. 5, weld bed 6 formed of stainless steel or ceramics has a thickness set as small as possible in structure. Planer type semiconductor element 5 is placed and fixed at weld bed 6 of FIG. 4 or 5. Interconnector 3 to provide an output is placed on electrode 4 of planer type semiconductor element 5. Weld electrodes 1 and 2 for parallel gap welding are abutted against interconnector 3. Load is applied on weld electrodes 1 and 2, and a current is conducted across weld electrodes 1 and 2. Welding is conducted by the resistance heat generated.

According to the planer type semiconductor device production apparatus and fabrication method using such a production apparatus of the present embodiment, the area of weld bed 6 in contact with the mounting plane of planer type semiconductor element 5 is set to be equal to the size of planer type semiconductor element 5 or smaller than the mounting area of planer type semiconductor element 5 with weld bed 6. Also, a stainless steel or ceramic weld bed 6 set as thin as possible in structure such as 3 mm is used. A weld bed 6 with both such features can also be used. Accordingly, the heat capacity is reduced, so that the heat quantity depleted by weld bed 6 among the heat generated for welding becomes smaller. Thus, favorable welding can be conducted. Weld bed 6 will not be affected by the room temperature since the temperature of 300° C. corresponding to weld bed 6 differs by one order of magnitude from the room temperature.

By providing ceramics of low thermal conductivity under a stainless steel weld bed 6 of 3 mm in thickness and reinforcing with an aluminum plate, welding can be conducted to achieve stable strength with small variation as compared to the variation in the general welding strength. Favorable results can be obtained. It is further advantageous to set the aluminum plate to 2 mm in thickness. Since an aluminum plate is employed for the reinforcing, no reduction in the strength of the weld bed was exhibited. A similar advantage can be achieved by using aluminum or ceramics instead of stainless steel. It was confirmed that a thickness of not more than 3 mm for the weld plate is effective. It is to be noted that, when ceramics is used, Teflon (R) that is lower in thermal conductivity than ceramics is provided under weld plate 6, and reinforced with an aluminum plate.

It is appreciated from Table 1 that the heat capacity is greatest for stainless steel when of the same volume. This means that a stainless steel weld bed derives the most heat. However, by reducing the thickness of the weld bed made of respective materials, the heat capacity can be reduced, and less vulnerable to lose heat for welding.

Many weld beds of a conventional planer type semiconductor device production apparatus are formed having a thickness of approximately 10 mm. This is ascribed to the structural strength of the weld apparatus. In the planer type semiconductor device production apparatus and fabrication method using such a production apparatus of the present embodiment, a reinforcement is fastened below the weld bed of the weld apparatus. Therefore, the structural strength of the weld bed can be reinforced. Thus, it is desirable to set the thickness of the weld bed to not more than 3 mm that can be realized in practice in order to exhibit the effect that allows favorable welding.

Fourth Embodiment

A planer type semiconductor device production apparatus and fabrication method of a planer type semiconductor device using such a production apparatus according to a fourth embodiment will be described with reference to FIGS. 6 and 7 and Table 2.

TABLE 2

|  | Welding Position P1 | Welding Position P2 | Welding Position P3 |
|---|---|---|---|
| Weld Order | 1 | 2 | 3 |
| Power | A | B | C |

Figure 6:
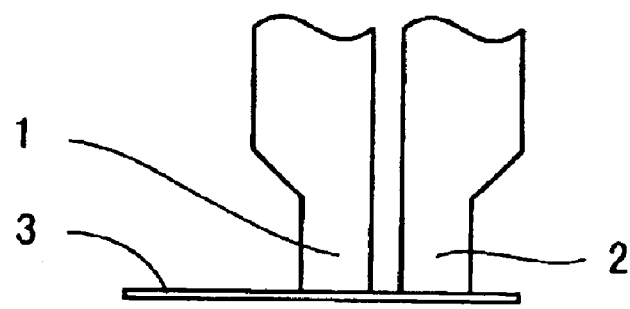
FIG. 6 is a schematic sectional view of a planer type semiconductor device production apparatus of a fourth embodiment.

As shown in FIG. 6, a planer type semiconductor element is placed and fixed on a weld bed. An interconnector 3 to provide an output is placed on an electrode of the planer type semiconductor element. Weld electrodes 1 and 2 for parallel gap welding of a width W are abutted against interconnector 3. Load is applied to weld electrodes 1 and 2, and a current is conducted across weld electrodes 1 and 2. Welding is conducted using the resistance heat generated.

Figure 7:
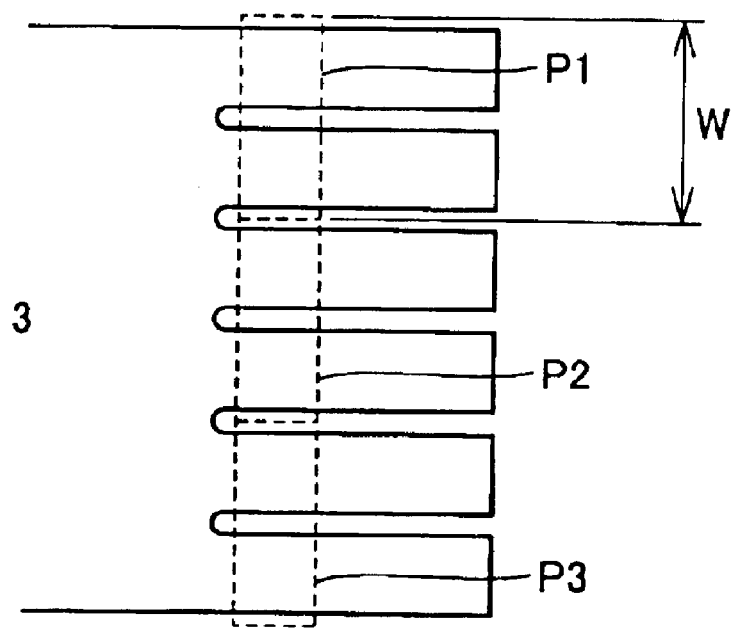
FIG. 7 is a plan view to indicate welding positions by the planer type semiconductor device production apparatus of the fourth embodiment.

As shown in FIG. 7, there are a plurality of weld sites in interconnector 3. The power for welding (A, B and C) for each of welding positions P1–P3 is set in the welding order of Table 2. By individually setting the power for welding at each welding position, the power for welding at a welding position where the welding strength was low can be increased. In contrast, the power for welding of a welding position to which excessive power was applied can be reduced. Thus, favorable welding can be conducted.

Fifth Embodiment

An example of a planer type semiconductor device production apparatus and a fabrication method of a planer type semiconductor device using such a production apparatus will be described with reference to Table 3 related to welding power setting.

TABLE 3

|  | Welding Operation 1 | Welding Operation 2 | Welding Operation 3 |
|---|---|---|---|
| Power | A | B | C |

In the planer type semiconductor device production apparatus and fabrication method using such a production apparatus of the present embodiment, likewise the above first to fourth embodiments, a planer type semiconductor element 5 is placed and fixed on a weld bed 6. An interconnector 3 to provide an output is placed on electrodes 1 and 2 of planer type semiconductor element 5. Weld electrodes 1 and 2 of parallel gap welding are abutted against interconnector 3. Load is applied to weld electrodes 1 and 2, and a current is conducted across weld electrodes 1 and 2. Welding is conducted using resistance heat generated. In the case where the welding operation is carried out for at least two times successively, the power for welding (A, B and C) is preset for each welding operation as in Table 3. By setting the power for welding for each welding operation in advance, the power for welding can be set relatively high since the temperature of weld electrodes 1 and 2 as well as weld bed 6 is low at the first welding operation. The power for welding can be set lower for the second welding operation. For the third welding operations and et seq. the temperature can be set appropriately since the temperature of weld bed 6 becomes stable. Thus, favorable welding can be conducted.

Sixth Embodiment

Figure 8:
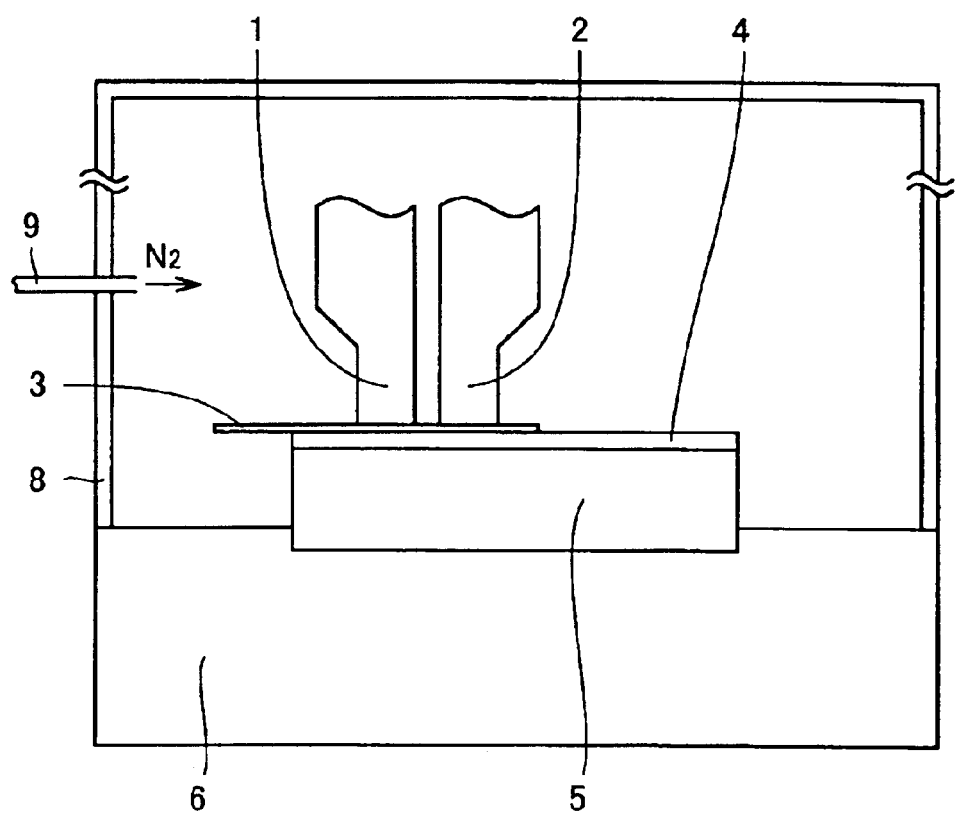
FIG. 8 is a schematic sectional view of a planer type semiconductor device production apparatus according to a sixth embodiment.
Figure 9:
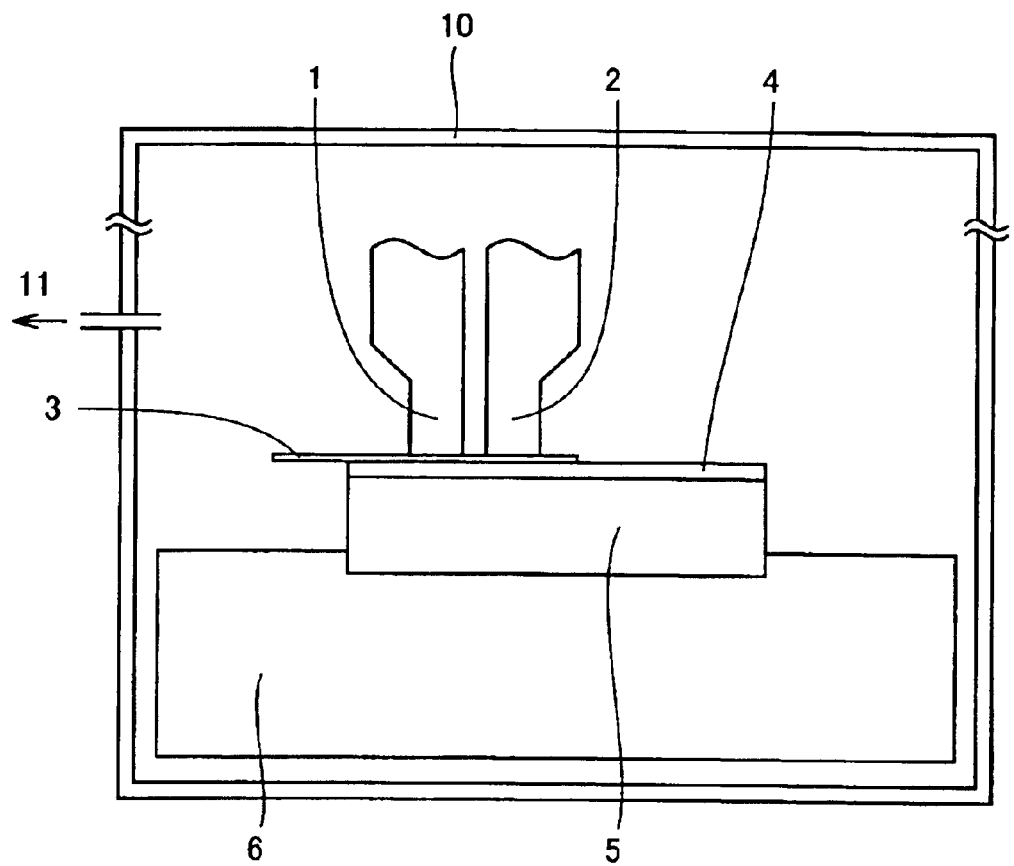
FIG. 9 is a schematic sectional view of a planer type semiconductor device production apparatus of another example in the sixth embodiment.

A planer type semiconductor device production apparatus and fabrication method of a planer type semiconductor device using such a production apparatus according to the sixth embodiment will be described with reference to FIGS. 8 and 9. In the present embodiment, a planer type semiconductor element 5 is placed and fixed on weld bed 6. An interconnector 3 to provide an output is placed on electrode 4 of semiconductor element 5. Weld electrodes 1 and 2 for parallel gap welding are abutted against interconnector 3. Load is applied to weld electrodes 1 and 2, and a current is conducted across weld electrodes 1 and 2. Welding is conducted using the resistance heat generated. The surrounding of at least weld electrodes 1 and 2 of the weld apparatus is set in a nitrogen gas atmosphere within an enclosure 8 that has an $N_2$ nozzle 9, or placed in a vacuum chamber 10 including an outlet 11 to achieve a vacuum state. By conducting welding in a nitrogen gas atmosphere or vacuum state, the glow of the weld electrodes and oxidation at high temperature can be suppressed. Thus, the lifetime of weld electrodes 1 and 2 can be increased.

In a conventional nitrogen gas blow, air is introduced, i.e. the oxygen in the air is incidentally introduced, whereby weld electrodes 1 and 2 will be oxidized. In the present embodiment, no oxygen is involved. Therefore, oxidation of weld electrodes 1 and 2 can be suppressed. Although the cost may be slightly increased in the present embodiment, the product yield is increased significantly, exhibiting high reliability. Thus, it is substantially more profitable.

Seventh Embodiment

Figure 10:
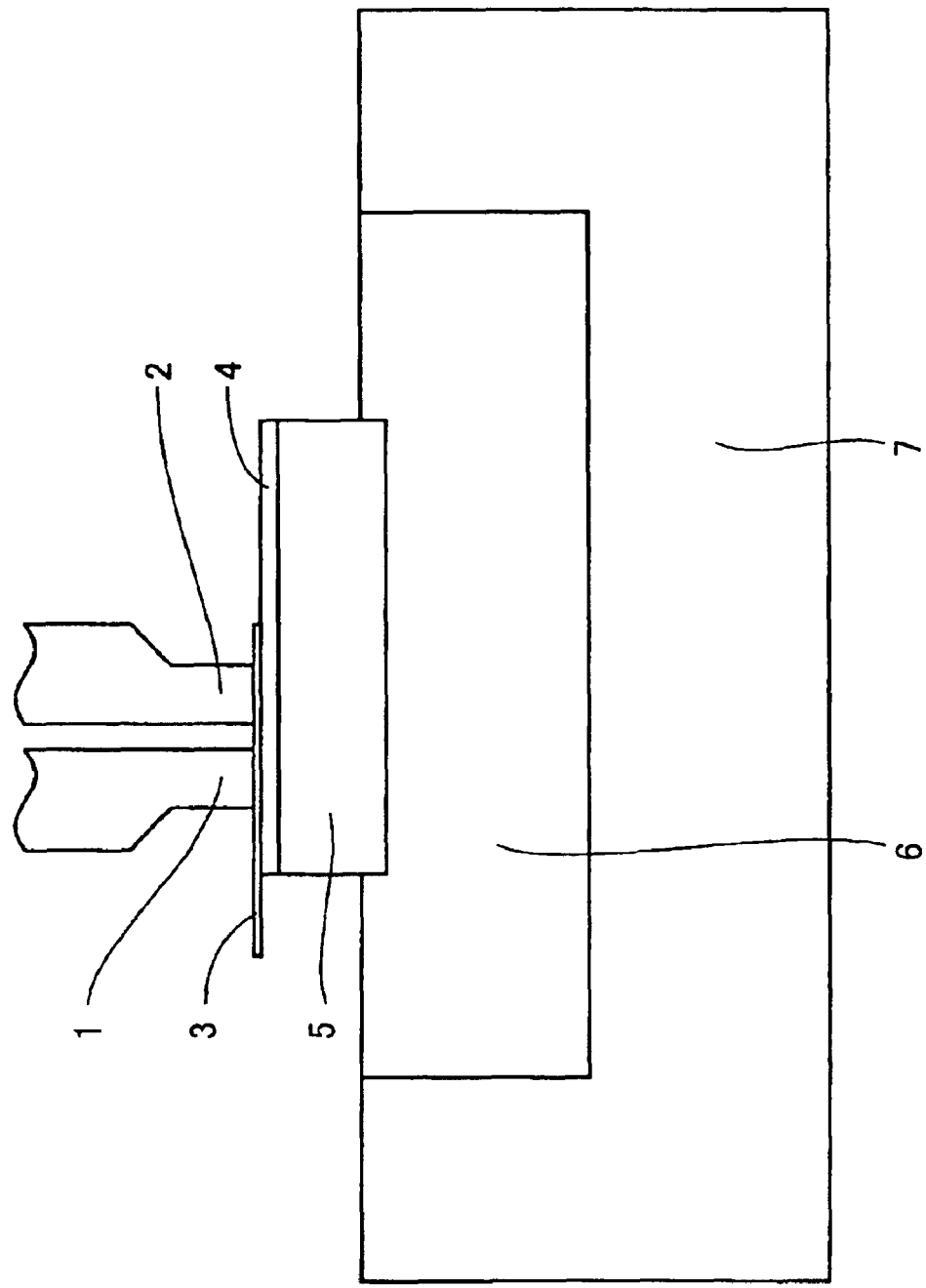
FIG. 10 is a schematic sectional view of a planer type semiconductor device production apparatus according to a seventh embodiment.
Figure 11:
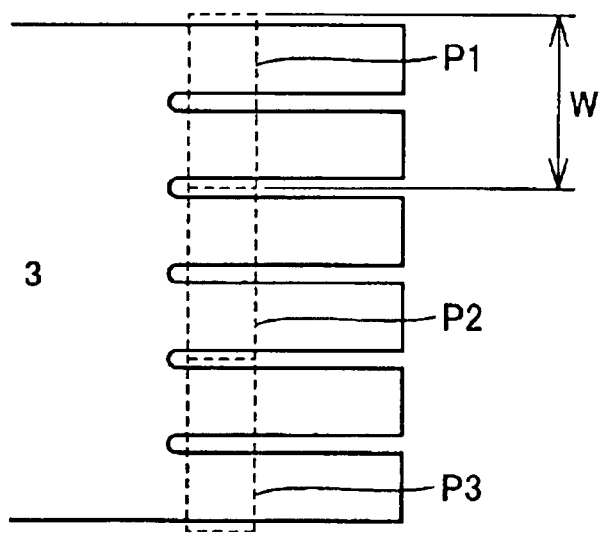
FIG. 11 is a plan view showing an interconnector connected by a planer type semiconductor device production apparatus of an eighth embodiment.
Figure 12:
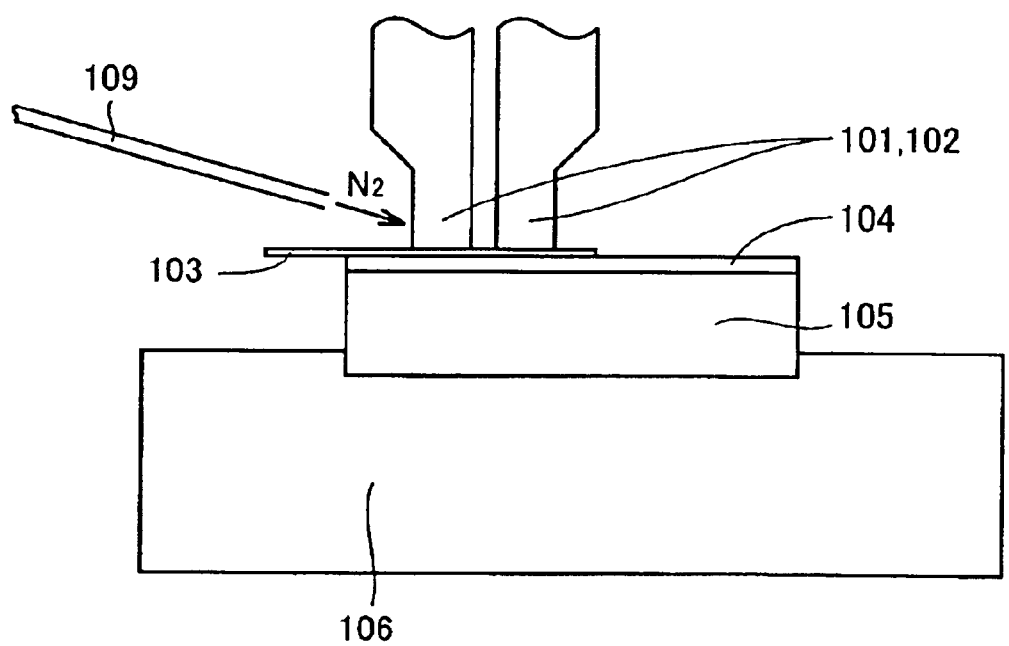
FIG. 12 is a schematic sectional view of a conventional planer type semiconductor device production apparatus.
Figure 13:
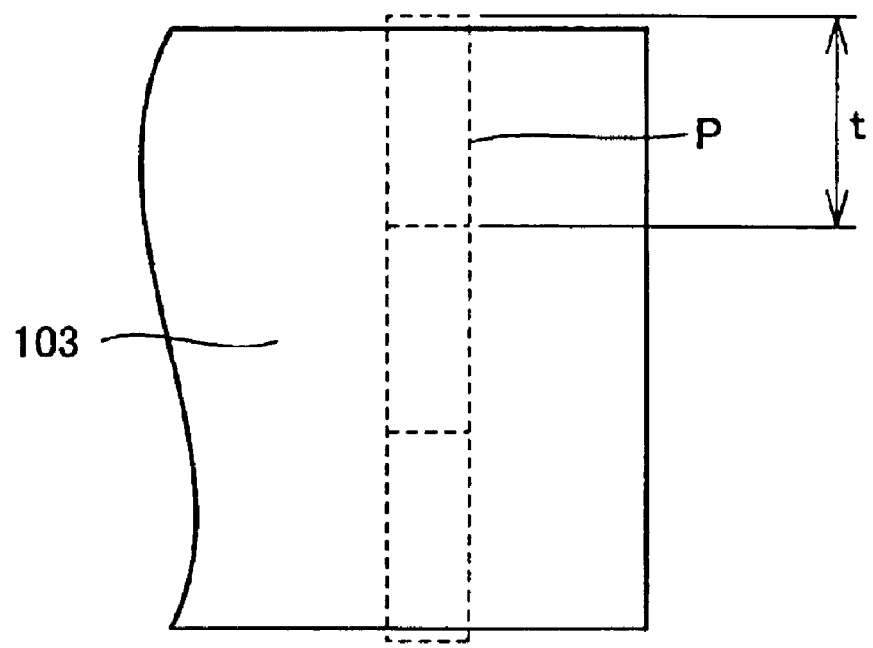
FIG. 13 is a plan view of a welding position by a conventional planer type semiconductor production apparatus.

A planer type semiconductor device production apparatus and fabrication method of a planer type semiconductor device using such a production apparatus according to a seventh embodiment will be described with reference to FIGS. 10 and 11.

TABLE 4

|  | Welding Position P1 | Welding Position P1 | Welding Position P3 |
|---|---|---|---|
| Weld Order | 1 | 2 | 3 |
| Power | A | B | C |

According to the planer type semiconductor device production apparatus and fabrication method using such a production apparatus of the present embodiment, a planer type semiconductor element 5 is placed and fixed on a stainless steel or ceramics weld bed 6 with a temperature control device 7 having temperature control capability. An interconnector 3 to provide an output is placed on an electrode 4 of planer type semiconductor element 5. Weld electrodes 1 and 2 of parallel gap welding having a width W are abutted against interconnector 3. Load is applied on weld electrodes 1 and 2, and a current is conducted across weld electrodes 1 and 2. Welding is conducted using the heat resistance generated. When there are a plurality of welding sites in interconnector 3 as shown in FIG. 11, the power for welding is preset for each of welding positions P1–P3 in the welding order of Table 4. Also, the power for welding may be set for each welding order, or for respective welding positions P1–P3 and welding orders. Accordingly, the heat generated for welding will not be depleted through weld bed 6. Welding can be conducted with an appropriate power suiting at least either the welding position or welding order.

According to the planer type semiconductor device production apparatus and fabrication method using such a production apparatus of the above-described embodiment, using a tungsten (W) electrode 1 and a copper (Cu) electrode 2 will provide the advantage that the effect of preventing heat escape is exhibited more significantly. When parallel gap welding is carried out by the combination of a tungsten electrode 1 and a copper electrode 2, tungsten electrode 1 generates heat in the welding process since the resistance of tungsten is higher than copper. This generated heat becomes the main power for welding.

Accordingly, the generated heat of tungsten electrode 1 will not escape. The power for welding of tungsten electrode 1 can be controlled. Also, oxidation of tungsten electrode 1 can be prevented.

Eighth Embodiment

A planer type semiconductor device production apparatus and a fabrication method of a planer type semiconductor device using such a production apparatus according to an eighth embodiment will be described with reference to FIG. 11. The present embodiment is similar to the above-described first to seventh embodiments, provided that interconnector 3 has a comb-shape with a slit. Accordingly, the advantages of the above-described first to seventh embodiments are exhibited more significantly. By using a comb-shaped interconnector 3 for welding, the manner of heat conduction from weld electrodes 1 and 2 becomes more sensitive due to the reduction of the area as compared to the area of a plate shape. The phenomenon appears definitely.

The features of the above-described planer type semiconductor device production apparatus and fabrication method using such a production apparatus of the first to eighth embodiments can be combined appropriately for usage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A planer type semiconductor device fabrication method comprising:

electrically connecting an interconnector to lead out an output of a planer type semiconductor element with an external output electrode of the planer type semiconductor element through parallel gap welding, wherein, when there are at least two sites of welding positions for one interconnector in said parallel gap welding, and a power for welding is set differently for each of said welding positions so that the interconnector is welded to the electrode using different power settings at different welding positions of the interconnector.

2. The planer type semiconductor device fabrication method according to claim 1, wherein said weld electrodes are formed of an electrode with tungsten as a main component and an electrode with copper as a main component.

3. The planer type semiconductor device fabrication method according to claim 1, wherein said interconnector has a comb shape with a slit.

4. The method of claim 1, wherein the interconnector is welded to the electrode using different power settings at different welding positions of the interconnector so that the power at a position where welding strength is low can be increased whereas power can be reduced at other positions.

5. A planer type semiconductor device fabrication method comprising:

electrically connecting an interconnector to lead out an output of a planer type semiconductor element with an external output electrode of a planer type semiconductor element through parallel gap welding, wherein when a welding operation is carried out at least first and second times successively in said parallel gap welding of the interconnector to the output electrode, and a power for welding is set in advance for each of said welding operations so that the power is set lower in said second subsequent welding operation than in said first welding operation.

6. A planer type semiconductor device fabrication method comprising:

electrically connecting an interconnector to lead out an output of a planer type semiconductor element with an external output electrode of the planer type semiconductor element through parallel gap welding, wherein a weld bed on which is placed a planer type semiconductor element to be welded is formed of a material with stainless steel or ceramics as a main component, said weld bed with stainless or ceramics as the main component being controlled in temperature using a weld bed temperature control mechanism, and a power for welding being set for at least one of each welding operation and each every welding position.

* * * * *